US006567773B1

(12) United States Patent
Rahmat et al.

(10) Patent No.: US 6,567,773 B1
(45) Date of Patent: May 20, 2003

(54) USE OF STATIC NOISE ANALYSIS FOR INTEGRATED CIRCUITS FABRICATED IN A SILICON-ON-INSULATOR PROCESS TECHNOLOGY

(75) Inventors: Khalid Rahmat, Yorktown, NY (US); Ronald D. Rose, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/441,797

(22) Filed: Nov. 17, 1999

(51) Int. Cl.[7] .............................................. G06F 17/50
(52) U.S. Cl. .............................. 703/14; 326/27; 326/83
(58) Field of Search ............................. 703/14; 326/27, 326/83

(56) References Cited

PUBLICATIONS

Kuang, et al. 'SRAM Bitline Circuits on PD SOI: Advantages and Concerns,' IEEE Journal of Solid State Circuits, vol. 32, No. 6, Jun. 1997, pp. 837–844.*

Chuang, et al. 'Dual–Mode Parasitic Bipolar Effect in Dynamic CVSL XOR Circuit with Floating–Body Partially–Depleted SOI Devices', 1997 International Symposium on VLSI Technology, Systems, and Applications, 1997. Proceedings of Technical Papers. pp.: 288.*

Wei, et al., 'Design Methodology for Minimizing Hysteretic VT–Variation in Partially–Depleted SOI CMOS,' International Electron Devices Meeting, 1997. Technical Digest., pp.: 411–414.*

Lu, et al, 'Floating Body Effects in Partially–Depleted SOI CMOS Circuits,' International Symposium on Low Power Electronics and Design, 1996., pp.: 1–5.*

Shepard, et al. "Noise in Deep Submicron Digital Design" IEEE/ACM International Conference on Computer–Aided Design. Nov. 10–14, 1996 pp. 524–531.

Chuang, et al. "SOI for Digital CMOS VLSI—Design Consideration and Advances" IEEE—pp. 1–25.

Wei, et al. "Measurement of Transient Effects in SOI DRAM/SRAM Access Transistors" IEEE Electron Device Letters, vol. 17, No. 5, May 1996 pp. 193–195.

* cited by examiner

Primary Examiner—Kevin J. Teska
Assistant Examiner—Samarina Makhdoom
(74) Attorney, Agent, or Firm—DeLio & Peterson LLC; Peter W. Peterson; H. Daniel Schnurmann

(57) ABSTRACT

A method and structure for analyzing the effect of electrical noise in an integrated circuit fabricated in a silicon-on-insulator ("SOI") technology. The present invention uses a static noise analysis to evaluate an integrated circuit's response to electrical noise, taking into account hysteresis effect and parasitic bipolar current voltage, both of which are unique to integrated circuits fabricated in a SOI technology process. The present invention also includes a computer, computer storage device, computer program and software incorporating the method steps and simulating the testing and analysis of the circuit under test.

24 Claims, 4 Drawing Sheets

USE OF STATIC NOISE ANALYSIS FOR INTEGRATED CIRCUITS FABRICATED IN A SILICON-ON-INSULATOR PROCESS TECHNOLOGY

BACKGROUND OF THE INVENTION

1. Field of the Invention

The present invention relates generally to a process for noise analysis of integrated circuits, and in particular to a process for static noise analysis of an integrated circuit fabricated in a silicon-on-insulator ("SOI") process technology.

2. Description of Related Art

Simulation-based static transistor-level analysis, both for noise and timing analysis, typically relies on fast circuit simulators such as ACES (an IBM internal simulator) or EPIC TIMEMILL (a product of Synopsis/EPIC). These simulators use a fixed set of models to represent the behavior of the transistors in the circuit, the model selection being done by the designer in the schematic. These fixed set of models do not allow the methods to take into account significant variation in the behavior of individual transistors in the circuit, whether due to process variation or (in the case of SOI) history effects.

Transistor-level analysis is popular for high performance designs, and technologies like SOI require that device variations be taken into account in such analysis. When significant variation exists in the behavior of individual transistors, a static analysis which is intended to ensure that specifications and functionality requirements are met, must take that variation into account. Variation in different transistors in a circuit can have different effects on the result being sought, i.e., having one transistor faster than average can increase noise, while having another faster than average can decrease noise. Therefore, methods which vary the behavior of all transistors in the network simultaneously, are inadequate.

Noise in integrated circuits can lead to functional failure of a circuit. Static analysis of noise in a circuit is a technique that analyzes the complete design in such a way that the entire design does not have to be simulated simultaneously at one time, which reduces the simulation time. Yet it guarantees that no failures will be missed.

This method of analysis is achieved by breaking each design into a set of subcircuits in such a way that the entire design is represented by a mathematical graph where the nodes of the graph represent the subcircuits, and the edges of the graph represent the nets or wire connections between the subcircuits. The graph is sorted, similar to levelization in static timing analysis, so that when any node is analyzed, all preceding circuits that could affect this node's inputs have previously been analyzed. Each subcircuit is analyzed completely in the presence of a variety of noise sources, with the results of the subcircuit simulations propagated to successor circuits in the larger design, using the sorted graph.

Analysis of each subcircuit for noise requires individual simulations of the subcircuit in the presence of various noise sources, to properly characterize the circuit's response to capacitive coupling noise, power supply variations, charge sharing within the subcircuit, and injected noise or noise coming from a preceding circuit to the inputs of the subcircuit. Injected noise analysis can also be extended to include a sensitivity analysis of the circuit, to characterize how the circuit will respond to the input noise and to understand how the output voltage of a circuit changes with respect to the input voltage changes caused by noise.

However, analysis of circuits fabricated in a partially depleted SOI process is further complicated by two effects, hysteresis and bipolar leakage.

Hysteresis is an effect in a circuit such that the behavior of the circuit depends on its state in the past, and can only be determined with the knowledge of the circuit's past behavior over a long period of time (many hundreds of switching cycles). Because the body nodes of SOI FETs are not explicitly tied to a power supply node, but rather left floating, the threshold voltage of the device varies in device operation and is conditional upon the body voltage. This varying threshold voltage changes the reaction of a circuit to normal and noisy input voltages. Thus knowing the voltage of all the terminals of a MOSFET in SOI technology, at any given moment in time, is not sufficient to predict its behavior in the future. The history of the voltage at those terminals is required in order to predict the behavior of the circuit. The noise analyses of the prior art do not take into account hysteresis, which limits the ability to effectively test and analyze integrated circuits fabricated in a SOI process technology.

Parasitic bipolar leakage is the current that can flow between the drain and source of an FET even when the gate is biased such that the FET is turned off In bulk CMOS technology, the parasitic bipolar exists, but the bipolar transistor is always off in normal device operation because the body in nFETs is grounded (or tied to Vdd for pFETs). This is not the case in SOI FETs, where the body node can be positively biased with respect to the source and may turn on the bipolar transistor. Significant current can flow between the source and drain of the transistor even when the gate is off, leading to noise on the circuit's output node, possibly causing functional failure of successor circuits. This effect is most important in dynamic circuits where the output voltage is determined by the voltage on a node which does not have a DC-path to the power supply voltage (VDD), but rather is determined by the capacitive charge on that node. Any leakage of that charge can produce a faulty output node value. The prior art does not intentionally set up conditions that will lead to bipolar leakage nor will it be modeled in a typical piecewise linear circuit simulator.

The prior art does not suggest simulations or models to account for the history effect, and using single-value body voltage models or floating body voltage models will not adequately simulate a worst case response to noise and could optimistically undercalculate a net's voltage deviation caused by noise.

Injected noise analysis of SOI circuits is not accurate unless both hysteresis and parasitic bipolar leakage current are taken into account during simulation. Similarly, a charge sharing simulation must take hysteresis and bipolar leakage into account to be accurate. Also, for the coupling noise calculation, the victim resistance used may depend on the threshold voltage of the victim FET and therefore, in the case of SOI, the use of fixed threshold voltage for all FET's would be correct.

Bearing in mind the problems and deficiencies of the prior art, it is therefore an object of the present invention to provide a method to analyze electrical noise in an integrated circuit fabricated in a SOI process technology.

It is another object of the present invention to provide a method of circuit analysis that accounts for the behavior of individual transistors in a circuit.

It is another object of the present invention to provide a method of circuit analysis that simulates the effects of hysteresis in an SOI circuit.

A further object of the invention is to provide a method of circuit analysis that simulates parasitic bipolar leakage current in an SOI circuit.

It is yet another object of the present invention to provide a method of analysis that simulates the behavior of individual transistors in an SOI circuit.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for analyzing electrical noise in an integrated circuit fabricated in a silicon-on-insulator process. In the preferred embodiment, the method comprises first describing an electrical circuit having at a least one transistor. At least one input voltage for the transistor is selected to precondition the circuit for a worse case response to electrical noise. In the preferred embodiment, the step of preconditioning the circuit for a worst case response to electrical noise comprises determining an output value of the circuit, determining an input voltage condition of the transistor that can cause the output value to change where the input voltage condition corresponds to the input voltage of the transistor. These steps can be repeated for each transistor in the circuit. A body voltage that is within normal operational bounds of the transistor, and affects a threshold voltage for the transistor such that the circuit is at its most sensitive state with respect to electrical noise, is selected for each transistor. In the preferred embodiment, the body voltage is selected by determining a stable output voltage of the circuit responsive to the input voltage. If the input voltage will cause the transistor to be in a conductive state which could cause a change in the value of the output voltage if the input voltage changes, the transistor is assigned a first model value. If the transistor is to be in a non-conductive state, and could cause a change in the value of the stable output voltage, the transistor is assigned a second model value corresponding to the body voltage of the transistor. A third model value is assigned to the transistor if a change in the input voltage will not cause a change in the output voltage. If the transistor is in an off mode while the circuit is at its most sensitive state with respect to electrical noise and the transistor is susceptible to a parasitic bipolar leakage current, the application of a current source across a source and drain node of the transistor is simulated. In the preferred embodiment, if the transistor is to be in a partially off mode, a simulated current source is applied across a source and a drain node of the partially off transistor if the source node is charged high while the drain node is charged low, or the source node is charged low while the drain node is charged high, while the circuit is at its most sensitive state with respect to electrical noise. In the preferred embodiment, the method is repeated for each transistor in the circuit. The circuit is presented to a simulator and simulated input voltages are applied to the input of each transistor in the circuit and the output voltage is measured. The input voltage to the transistor is adjusted to simulate electrical noise on the input by causing a high input voltage to go low or a low input voltage to go high and the output of the circuit recorded. The simulation and adjustment of the input voltage can be repeated for each transistor in the circuit. In the preferred embodiment, the method is repeated for each input voltage selected for each transistor in the circuit. The circuit's worse case response to electrical noise is determined by comparing the recorded output voltages.

In another aspect, the present invention provides a method for analyzing electrical noise in an integrated circuit fabricated in a silicon-on-insulator process comprising requesting an analysis of a circuit comprising a plurality of electronic components including at least one transistor. An input voltage for each transistor which preconditions the circuit for a worse case response to an electrical noise is determined. Each transistor which is in an off mode while the circuit is preconditioned for a worst case response to an electrical noise input and is susceptible to a parasitic bipolar leakage current has a simulated current source applied across its source and drain node, to approximate a bipolar current. The circuit is then presented to a simulator which simulates the application of an input voltage to each transistor in the circuit. A first output voltage of the circuit is recorded, and the input voltage is adjusted to simulate electrical noise on the input of the transistor. A second output voltage responsive to the adjusted input voltage is recorded. The method may be repeated for each transistor in the circuit, and the worst case response to electrical noise is determined by comparing the recorded output voltages.

In another aspect, the present invention provides a program storage device readable by a machine, tangibly embodying a program of instructions executable by the machine to perform method steps for analyzing electrical noise in an integrated circuit fabricated in a silicon-on-insulator process. In the preferred embodiment, the method steps comprise first describing an electrical circuit having at least one transistor and selecting at least one input voltage to precondition the circuit for a worse case response to electrical noise. In the preferred embodiment, the step of preconditioning the circuit for a worst case response to electrical noise comprises determining an output value of the circuit and determining an input voltage condition of the transistor that can cause the output value to change, where the input voltage condition corresponds to the input voltage of said transistor. These steps can be repeated for each transistor in the circuit. A body voltage for the transistor that is within normal operational bounds of the transistor and affects a threshold voltage for the transistor such that the circuit is at its most sensitive state with respect to electrical noise is selected. In the preferred embodiment, the body voltage is selected by determining a stable output voltage of the circuit responsive to the input voltage. If the input voltage will cause the transistor to be in a conductive state and which could cause a change in the value of the output voltage if the input voltage changes, the transistor is assigned a first model value. If the transistor is to be in a non-conductive state, and which could cause a change in the value of the stable output voltage, the transistor is assigned a second model value. A third model value is assigned to the transistor if a change in the input voltage does not cause a change in the output voltage. If the transistor is in an off mode while the circuit is at its most sensitive state with respect to electrical noise and the transistor is susceptible to a parasitic bipolar leakage current, the application of a current source across a source and drain node of the transistor is simulated. In the preferred embodiment, if the transistor is to be in a partially off mode, a simulated current source is applied across a source and a drain node of the partially off transistor if the source node is charged high while the drain node is charged low, or the source node is charged low while the drain node is charged high, and the circuit is at its most sensitive state with respect to electrical noise. In the preferred embodiment, the method is repeated for each transistor in the circuit. The circuit is then presented to a simulator and simulated input voltages are applied to the input of transistors in the circuit and the output voltage of the circuit is measured at the output node. The input voltage is then adjusted to simulate electrical noise on the input by causing a high input voltage to go low or a low input voltage to go high, and the output of the circuit is recorded. The simulation and adjustment of the input voltage can be repeated for each transistor in the circuit. In the preferred embodiment, the method is repeated for the selected input voltages for each transistor in the circuit. The circuit's worse case response to electrical noise is determined by comparing the recorded output voltages.

In another aspect, the present invention provides a program storage device readable by a machine, tangibly embodying a program of instructions executable by the machine to perform method steps for analyzing electrical noise in an integrated circuit fabricated in a silicon-on-insulator process, the method steps comprising requesting an analysis of a circuit comprising a plurality of electronic components including at least one transistor. An input voltage to be applied to an input of each transistor in the circuit is determined which preconditions the circuit for a worse case response to an electrical noise input. Each transistor which is in an off mode while the circuit is preconditioned for a worst case response to the electrical noise input and is susceptible to a parasitic bipolar leakage current has a simulated current source applied across its source and drain node, to approximate a bipolar current. The circuit is then presented to a simulator which simulates the application of an input voltage to each transistor in the circuit. A first output voltage of the circuit is recorded, and the input voltage is adjusted to simulate electrical noise on the input of the transistor. A second output voltage responsive to the adjusted input voltage is recorded. The method may be repeated for each transistor in the circuit, and the worst case response to electrical noise is determined by comparing the recorded output voltages.

In another aspect, the present invention provides an article of manufacture comprising a computer usable medium having computer readable code means embodied therein for causing the analysis of electrical noise in an integrated circuit fabricated in a silicon-on-insulator process, the computer readable code means comprising a computer useable medium having computer readable code means embodied in the medium for causing the analysis of electrical noise in an integrated circuit fabricated in a silicon-on-insulator process. The computer readable code means comprises computer readable code means for causing a computer to simulate an electrical circuit, including at least one transistor, in a data model and computer readable code means for causing a computer to select at least one input voltage for the transistor to precondition the circuit for a worse case response to electrical noise. In the preferred embodiment, the computer readable code means causes the computer to precondition the circuit for a worst case response to electrical noise by determining an output value of the circuit and determining an input voltage condition of the transistor that can cause the output value to change, where the input voltage condition corresponds to the input voltage of the transistor. The computer readable code means may cause the computer to repeat these steps for each transistor in the circuit. The computer readable code means further causes the computer to select a body voltage for each transistor that is within normal operational bounds of the transistor and affects a threshold voltage for the transistor such that the circuit is at its most sensitive state with respect to electrical noise. In the preferred embodiment, the computer readable code means causes the computer to select a body voltage by determining a stable output voltage of the circuit responsive to the input voltage. If the input voltage will cause the transistor to be in a conductive state and which could cause a change in the value of the output voltage if the input voltage changes, the computer readable code means causes the computer to assign the transistor a first model value. If the transistor is to be in a non-conductive state, and which could cause a change in the output voltage if the input voltage changes, the computer readable code means causes the computer to assign the transistor a second model value corresponding to the body voltage of the transistor. The computer readable code means causes the computer to assign a third model value to the transistor if a change in the input voltage does not cause a change in the output voltage. The computer readable code means further causes the computer to determine if the transistor is to be in an off mode while the circuit is at its most sensitive state with respect to electrical noise and is susceptible to a parasitic bipolar leakage current, and if so, to simulate the application of a current source across a source and drain node of the transistor. In the preferred embodiment, the computer readable code means causes the computer to determine if the transistor is to be in a partially off mode, and simulate the application of current source across a source and a drain node of the partially off transistor if the source node is charged high while the drain node is charged low, or the source node is charged low while the drain node is charged high, while the circuit is at its most sensitive state with respect to electrical noise. In the preferred embodiment, the computer readable code means may cause the computer to repeat the method for each transistor in the circuit. The computer readable code means causes the computer to present the circuit to a simulator and simulate the application of an input voltage to the transistor. The computer readable code means causes the computer to measure the output voltage of the circuit at the output node and then adjust the input voltage to simulate electrical noise on the input by causing a high input voltage to go low or a low input voltage to go high, and again record the output voltage. The computer readable code means may cause the computer to repeat the simulation and adjustment of the input voltage for each transistor in the circuit. In the preferred embodiment, the computer readable code means causes the computer to repeat the method for each input voltage selected for each transistor in the circuit. The computer readable code means causes the computer to determine the circuit's worse case response to electrical noise.

In another aspect, the present invention comprises an article of manufacture comprising a computer usable medium having computer readable code means embodied therein for causing the analysis of electrical noise in an integrated circuit fabricated in a silicon-on-insulator process, the computer readable code means comprises computer readable code means for causing a computer to effect the simulation of an electrical circuit having at least one transistor to be analyzed and to determine an input voltage for each transistor in the circuit, the input voltage selected to precondition the circuit for a worst case response to an electrical noise input. The computer readable code means causes the computer to determine which transistor is in an off mode while the circuit is preconditioned for a worst case response to the electrical noise input and is susceptible to a parasitic bipolar leakage current, and to simulate a current source across the source and drain node of the transistor to approximate a bipolar current. The computer readable code means causes the computer to present the circuit to a simulator and simulate the application of an input voltage to the transistor and record a first output voltage of the circuit. The computer readable code means causes the computer to adjust the input voltage of the transistor to simulate an electrical noise on the input of the transistor and record the output voltage. The computer readable code means causes the computer to repeat the method for each transistor in the circuit. The computer readable code means causes the computer to determine the worst case response to electrical noise by comparing the recorded output voltages.

In yet another aspect, the present invention provides a computer program product for use with an electrical circuit testing apparatus, the computer program product comprising a computer useable medium having computer readable code means embodied in the medium for causing the analysis of electrical noise in an integrated circuit fabricated in a silicon-on-insulator process. The computer readable code means comprises computer readable code means for causing a computer to simulate an electrical circuit including at least one transistor in a data model and computer readable code means for causing a computer to select at least one input voltage for the transistor to precondition the circuit for a worse case response to electrical noise. In the preferred embodiment, the computer readable code means causes the computer to precondition the circuit for a worst case response to electrical noise by determining an output value of the circuit and determining an input voltage condition of the transistor that can cause the output value to change, where the input voltage condition corresponds to the input voltage of the transistor. The computer readable code means may cause the computer to repeat these steps for each transistor in the circuit. The computer readable code means further causes the computer to select a body voltage for each transistor that is within normal operational bounds of the transistor and affects a threshold voltage for the transistor such that the circuit is at its most sensitive state with respect to electrical noise. In the preferred embodiment, the computer readable code means causes the computer to select a body voltage by determining a stable output voltage of the circuit responsive to the input voltage and if the input voltage will cause the transistor to be in a conductive state and which could cause a change in the value of the output voltage if the input voltage changes, the computer readable code means causes the computer to assign the transistor a first model value. If the transistor is to be in a non-conductive state, and a change in the input voltage could cause a change in the value of the stable output voltage, the computer readable code means causes the computer to assign the transistor a second model value corresponding to the body voltage of the transistor. The computer readable code means causes the computer to assign a third model value to the transistor if a change in the input voltage does not cause a change in the output voltage. The computer readable code means further causes the computer to determine if the transistor is to be in an off mode while the circuit is at its most sensitive state with respect to electrical noise and if the transistor is susceptible to a parasitic bipolar leakage current, and if so, to simulate the application of a current source across a source and drain node of the transistor. In the preferred embodiment, the computer readable code means causes the computer to determine if the transistor is to be in a partially off mode, and to simulate the application of current source across a source and a drain node of the partially off transistor if the source node is charged high while the drain node is charged low, or the source node is charged low while the drain node is charged high, while the circuit is at its most sensitive state with respect to electrical noise. In the preferred embodiment, the computer readable code means may cause the computer to repeat the method for each transistor in the circuit. The computer readable code means causes the computer to present the circuit to a simulator and simulate the application of an input voltage to the input of the transistor. The computer readable code means causes the computer to measure the output voltage of the circuit at the output node and then adjust the input voltage to simulate electrical noise on the input by causing a high input voltage to go low or a low input voltage to go high and again record the output voltage The computer readable code means may cause the computer to repeat the simulation and adjustment of the input voltage for each transistor in the circuit. In the preferred embodiment, the computer readable code means causes the computer to repeat the method for each input voltage selected for each transistor in the circuit. The computer readable code means causes the computer to determine the circuit's worse case response to electrical noise.

In a further aspect, the present invention provides a computer program product for use with an electrical circuit testing apparatus, the computer program product comprising a computer useable medium having computer readable code means embodied in the medium for causing the analysis of electrical noise in an integrated circuit fabricated in a silicon-on-insulator process, the computer program product having: computer readable code means for causing a computer to effect the simulation of an electrical circuit having at least one transistor to be analyzed and to determine an input voltage for each transistor in the circuit, the input voltage selected to precondition the circuit for a worst case response to an electrical noise input. The computer readable code means causes the computer to determine which transistor is in an off mode while the circuit is preconditioned for a worst case response to the electrical noise input and is susceptible to a parasitic bipolar leakage current, and to simulate a current source across the source and drain node of the transistor to approximate a bipolar current. The computer readable code means causes the computer to present the circuit to a simulator and simulate the application of an input voltage to each transistor in the circuit. The computer readable code means causes the computer to record a first output voltage of the circuit and to adjust the input voltage of the transistor to simulate an electrical noise on the input of the transistor. The computer readable code means causes the computer to record a second output voltage responsive to the adjusted input voltage, and may repeat the method for each transistor in the circuit. The computer readable code means causes the computer to determine the worst case response to electrical noise by comparing the recorded output voltages.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
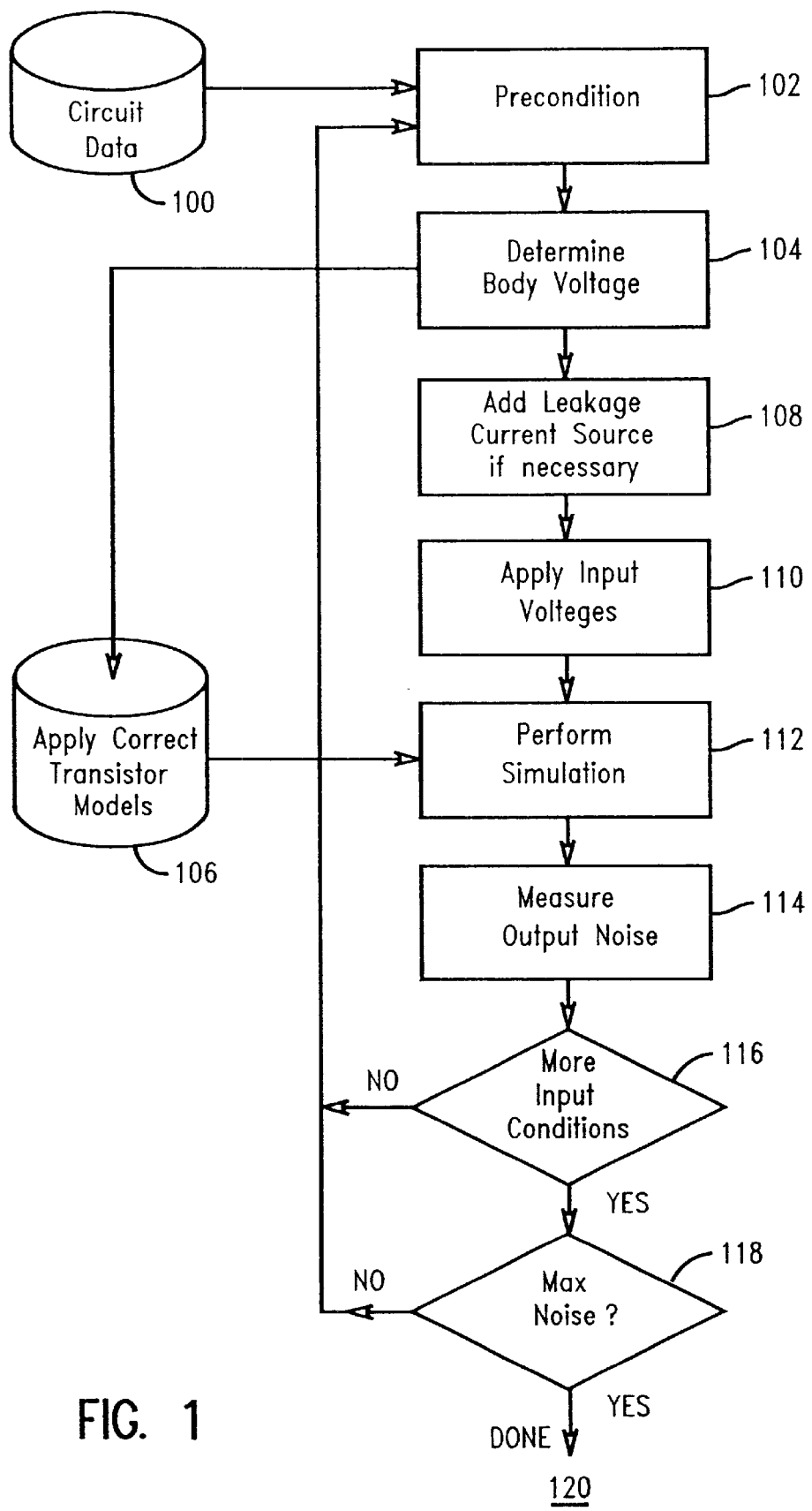
FIG. 1 is a flow chart of the process of the present invention.

In describing the preferred embodiment of the present invention, reference will be made herein to FIGS. 1–4 of the drawings in which like numerals refer to like features of the invention. Features of the invention are not necessarily shown to scale in the drawings.

This invention provides a method for noise analysis of an integrated circuit fabricated in a silicon-on-insulator process technology. The invention uses static noise analysis to check integrated circuits fabricated in silicon-on-insulator process technology for electrical noise problems. These noise problems can lead to functional failure of the circuits.

Static noise analysis is an approach to circuit analysis that allows the circuit designers to check the functionality of the circuit without specifying all possible input patterns. Static noise analysis has been used in the past for circuits fabricated in bulk silicon technology, but not for silicon-on-insulator technology which has new effects that need to be analyzed. These new physical effects include hysteresis and parasitic bipolar current which are unique to SOI technology in noise analysis. Hysteresis, or memory effect, is a circuit effect in which the behavior of a circuit can depend on its past. Parasitic bipolar current is a new current leakage mechanism. The present invention provides a method of static noise analysis to be used for silicon-on-insulator technology and completely checks the circuit for these new physical effects encountered, as well as the effects present in bulk silicon technology. This invention may or may not be part of a larger static noise analysis system, although the examples described below will focus on its use within a static noise analysis system.

Generally, the hysteresis effect of a circuit can only be determined by knowledge of its past behavior over a long period of time. The prior art static noise analysis approach does not simulate the circuit over a long period of time, but instead, performs a single simulation that is representative of the worst case scenario for noise effects. This approach is inconsistent with SOI process technology. The present invention solves this inconsistency by providing a method that uses an estimate of the previous behavior of the circuit in such a way that it provides the most conservative scenario for static noise analysis.

Over time, a FET's body voltage is affected by the FET's terminal (gate, source and drain) voltages. This body voltage can greatly affect the threshold voltage of the device, thereby altering its ability to bring or hold an output net to a desired voltage. Rather than try to simulate a large set of typical input conditions over a long period of time in order to set up a worst case body voltage in each FET, (a highly inefficient approach), we precondition each FET's body voltage to give that circuit a worst case response to noise. This does not imply that we simply give all FET's the same body voltage. Some FET's may be given body voltages which raise their threshold voltage, and others may be given a body voltage to lower their threshold voltage, depending on the topology of the circuit and its noisy input conditions. The assigned body voltages will allow us to simulate the entire circuit's worst case response to noise.

The method of the present invention also includes simulating parasitic bipolar current, a new type of leakage current present in silicon-on-insulator technology, in a static noise analysis. The magnitude and duration of the current which produces noise, depends on the past history of the circuit. Rather than do simulations for a long time under all possible input combinations, the specific case under which the largest parasitic leakage current will flow is determined, and is used in a single simulation to determine the noise that will be induced by this effect. If a node is susceptible to bipolar leakage current flow then an explicit current source is turned on at the time when it can produce the maximum noise at the output node. The waveform for the current can be chosen independently of the circuit but depends only on the width of the FET that has the bipolar leakage, due to the observation described below.

Noise is determined by the total charge flow caused by bipolar leakage current and not the magnitude and duration of the current. Therefore, a simple current source with the appropriate integrated charge can be used to estimate leakage current. This leakage current is applied to all nodes of the circuit that are susceptible to this type of noise.

To exactly model the leakage current requires detailed modeling of the parasitic bipolar current, junction capacitors and the generation-recombination currents in the FET's. The method of the present invention simplifies this modeling by using a current source in parallel with transistors that could exhibit leakage to model the leakage current. The integrated charge of the leakage current is approximately constant per unit FET width for a given process technology (assuming minimum length FET's). The dynamics of the leakage current do not significantly impact the peak noise induced in a circuit node.

By combining these two techniques, the static noise analysis can be used for integrated circuits built on silicon-on-insulator technology.

In the preferred embodiment of the present invention, the following software components may be used to implement the method. First, a design model (or data model) representing the design being analyzed is provided. A routine to set up input voltages to the circuit to precondition the circuit for a worst-case response to noise is developed, as is a transistor-level simulator to analyze the response of the circuit to the input voltages. A transistor simulator is used to model the response of a transistor under various body and input voltage conditions. Finally, an evaluator is used to determine the worst-case response to noise.

As shown in FIG. 1, in the preferred embodiment, the method of the present invention is implemented as follows:

1. A circuit is described at the transistor-level in the data model 100.
2. Input voltages are determined such that they precondition the circuit for a worst-case response to noise 102.
3. Each transistor is examined, and an appropriate model with an appropriate body voltage is selected for the transistor. An appropriate body voltage is one that is within normal operation bounds and which affects the threshold voltage for this device such that the entire circuit is at its most sensitive state with respect to noise, so that its response to the noise will be its worst, within normal operation bounds 104.
4. A current source to approximate the bipolar current is attached across the source and drain nodes of transistors that are off and whose conditions could lead to leakage 108. The most common of these conditions are that both the source and the drain of an nFET are initially at or near VDD and one of the terminals is pulled low, or that both the source and drain of a pFET are low and one of these is pulled high.
5. The initial input voltages are applied to the circuit 110.

6. The input voltages are adjusted to show noise on the inputs, causing a normally high voltage to dip lower or a normally low voltage to rise. The circuit is presented to the simulator for simulation 112.

7. The circuit's output voltage response is captured 114.

8. If more input conditions must be simulated, step 2 102 is repeated 116.

9. The circuit's worst response to the various input conditions is determined and noted 118. If a worse case response is not noted, the process repeats starting at 102.

This provides the ability to look at many different preconditioning scenarios and choosing the one that gives the maximum noise.

Step 112 in FIG. 1 is the actual simulation performed on the circuit once the inputs, voltages and transistor model have been determined. There are many different circuit simulation engines that can be used to do this. Some examples are "powerSPICE" or "ACES" which are "IBM" proprietary simulators, "SPICE" from the University of California, Berkeley, and "Star-HSPICE" from Avanti Corp. The choice or use of the circuit simulation engine itself does not affect the method described in this invention.

Steps 104 and 108, along with the dynamic control of the transistor model, are discussed in more detail below.

Step 108 (step 4 below) may be added as part of the injected noise analysis described, or separately, replacing step 104 (step 3 below), creating an analysis that will measure and report maximum leakage alone.

This invention applies to both bulk and SOI circuits.

In another aspect, the preferred embodiment of the present invention is described as follows:

1. An application requests an analysis of a circuit, which may be a subcircuit of a larger design.
2. A set of input voltages are created for each transistor device in the circuit that preconditions the circuit for a worst-case response to noise.
3. An initial body voltage is selected for each transistor device. The initial body voltage is determined by the connectivity of the device, the conductivity desired and the set of input voltages 104.

The connectivity of the transistor device is determined by whether or not the drain or source of the FET is tied to a power supply rail. For an nFET device this is Gnd and for a pFET device it is Vdd.

If the device is to be in a most conductive state, for an nFET this corresponds to the highest body voltage, while for a pFET device this corresponds to the lowest body voltage. Similarly, if the transistor device is to be in a least conductive state, for an nFET this is the lowest body voltage, while for a pFET it is the highest body voltage.

Each SOI technology process will have different body voltage ranges during normal operation. The following naming conventions are used to name the various body voltage options:

HOT Device is to be most conductive.

The source or drain of the device is not tied to a power supply rail. (VDD or GND.)

Body voltage is selected that causes a low threshold voltage.

WARM Device is to be most conductive.

Source or drain of device is tied to a power supply rail. (VDD or GND).

Body voltage is selected that causes a low threshold voltage.

COLD Device is to be least conductive.

Source or drain may not be tied to a power supply rail.

Body voltage is selected that causes a higher threshold voltage.

While only three levels of body voltages (HOT, WARM, COLD) are described here, additional levels can be used with an associated rule for recognizing when the appropriate body voltage is to be applied to a given FET.

A review of the input voltages determines which initial body voltage to use for each device according to the following rules:

(a) If the circuit's starting input voltages turn a device off, and the device, if conducting, will help pull the output node in the opposite direction of the stable output voltage, and if noise is to be applied to the device such that it could turn on, even partially or momentarily, the device is given a HOT or WARM preconditioning. WARM if the source or drain is tied to a power supply rail, HOT if not. This makes these devices the most conductive, allowing them to most easily pull the output node in the direction opposite of the desired voltage.

(b) If the circuit's starting input voltages turn a device on, and the device, if conducting, will help pull the output node in the same direction as the stable output voltage, and if noise is to be applied to the device such that it could turn off, even partially or momentarily, the device is given a COLD preconditioning, to make it the least conductive and the least able to pull in the desired direction, opposing the conduction in the opposite direction of the noise-conducting devices.

(c) If a circuit's starting input voltages turn a device on, and it is to remain on for the entire simulation, and the device conducts to a source that pulls the output node in the desired stable direction, with no gate input noise to potentially turn the device off, the device is given a COLD preconditioning. This gives the device its highest threshold voltage and its least conductive state, there by opposing the potential output noise the least.

(d) If a circuit's starting input voltages turn a device off, and it will remain off throughout the simulation, it is given one of the HOT, COLD or WARM preconditionings, dependent on these rules:

(i) If the device is a pFET and on a path to Vdd and the stable output voltage is high, the device is given a COLD preconditioning, to make it the least conductive, in case, by some circuit situation, it should start conducting.

(ii) If the device is an nFET and on a path to Gnd and the stable output voltage is high, the device is given a HOT or WARM preconditioning, to make it the most conductive, in case, by some circuit situation, it should start conducting.

(iii) If the device is a pFET and on a path to Vdd and the stable output voltage is low, the device is given a WARM or HOT preconditioning, to make it the most conductive, in case, by some circuit situation, it should start conducting.

(iv) If the device is an nFET and on a path to Gnd and the stable output voltage is low, the device is given a COLD preconditioning, to make it the least conductive, in case, by some circuit situation, it should start conducting.

4. A current source to approximate the bipolar current is attached across the source and drain nodes of transistors that are off and whose conditions could lead to leakage. The current source is used to approximate the bipolar leakage current of the device during normal operation, and is necessary for simulators whose models do not model leakage current or where the leakage current calculation will be slow because it depends on the past history of the node voltages of the FET. The magnitude and duration of the current which produces noise depends on the past history of the circuit and the circuit's condition or terminal voltages. This would require that simulations be done under all possible input combinations to determine the largest leakage current that will flow for this particular circuit. However, observations show that the total noise, or output voltage deviation, is determined by the total charge flow, and not on the details of the magnitude and duration of the current. Therefore a simple current source with the approximate integrated charge can be used to estimate the leakage current. Such a leakage current source is explicitly introduced in the circuit for the purposes of noise analysis across all devices that are susceptible to this type of noise.

A leakage charge depends proportionally on the FET widths, but may be different for nFETs and pFETs. Also, either the same waveform may be used for the leakage current for all the FET's, or different waveforms may be used as long as they have the same area with the same integrated charge.

To determine which transistors will have current sources, review the circuit, its input voltages and device types (pFET or nFET), and select devices to receive a current source across its source and drain terminals, determined by the set of input voltages and the particular device type, using the rules outlined below.

a) If the device is to be fully on throughout the simulation, it should not receive a current source.

b) If a device is to be off, either fully or partially off, attach a current source if one source/drain terminal will be charged high while the other source/drain terminal will be discharged low.

Because the integrated charge of the leakage current is approximately constant per unit FET width for a given process technology, assuming minimum length FETs, each current source is sized based on the width of the device it crosses.

5. The circuit is presented to the simulator for simulation.
6. The initial input voltages are applied to the circuit.
7. The input voltages are adjusted to show noise on the inputs, causing a normally high voltage to dip lower or a normally low voltage to rise. These conditions are simulated.
8. The circuit's output voltage response is captured.
9. The circuit's response is compared to other output responses of the same circuit for different input conditions, and the worst is noted, based on any desired comparison method (amplitude comparisons, wave shape comparisons, etc.).

The following examples are illustrative.

Figure 2:
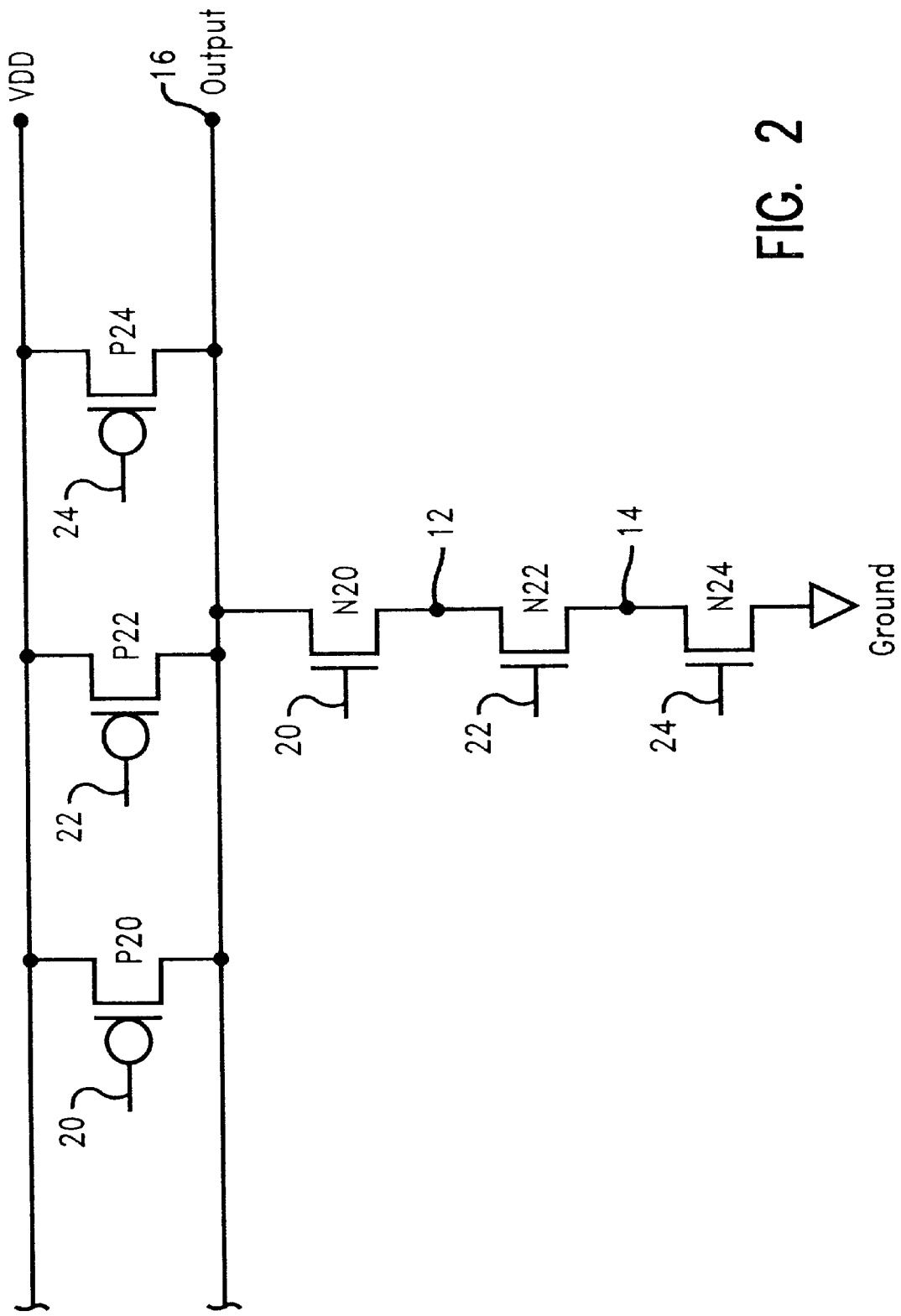
FIG. 2 is a schematic drawing of a 3-way NAND circuit.

Example 1 (FIG. 2)

FIG. 2 illustrates an injected noise analysis of a 3-way NAND circuit, accounting for hysteresis and bipolar leakage using the HOT/WARM/COLD modeling assignment and the addition of a leakage current source described in the preferred embodiment.

We describe the execution of the invention on the network of FIG. 2, where

P is used to represent a pFET device, and

N is used to represent a nFET device.

Input pins are labeled as 20, 22 and 24, and the output pin is labeled 16. The internal nodes are labeled as 12 or 14.

Step 1.

This circuit is described in the data model as an interconnection of nets, sources, and devices.

Step 2.

Input voltages are determined such that they precondition the circuit for a worst-case response to noise.

For this circuit, we have two possible output states, 1 and 0.

If the output is to be simulated for its affect on a stable output value of 1, there are several input voltage conditions which could be the worst preconditioning for noise.

Case 1. Input 20=0

Input 22=1

Input 24=1

This means output 16 is held high with one transistor, P20, conducting to Vdd.

This also means N20 and N22 are conducting, discharging the internal nodes, 12 and 14, to 0 or ground potential.

If input 20, while set to a logic 0, receives noise such that input 20's voltage rises from ground, N20 will conduct, perhaps even slightly, creating a path to ground, which will cause output 16 to dip below Vdd. How much the output dips is dependent on how much high-going noise is present on input 20, and how much N20 conducts as a result of that noise on input 20.

Step 3.

Review the circuit, its input voltages and device types (pFET or nFET). Select a device initial body voltage for each device, determined by the set of input voltages and the particular device type, using the rules outlined above. (In this example, input 20=0, 22=1 and 24=1).

1. P20 is conducting, with noise that may cause it to conduct less during simulation of the noisy input conditions. It is assigned a COLD model, so that it has the least conductive ability, causing it to conduct the least in the presence of this high-going pulse on input 20.
2. P22 is not conducting, but is between the output node 16 and Vdd. We give it a COLD model, so that it is least conductive.
3. P24 is not conducting, but is between the output node 16 and Vdd. We give it a COLD model, so that it is least conductive.
4. N20 is off, but possibly conducting such that it can help the output node 16, deviate from its stable 1 value. It is given a HOT model, because it is not source-connected, so that it is the most conductive in the presence of its gate input noise.
5. N22 is conducting, and leads to ground, a source with a value opposite of the desired stable output value. It is assigned a HOT model so that it is at its most conductive state.
6. N24 is on and leads to ground, a source with a value opposite of the desired stable output value. It is assigned a WARM model so that it is at its most conductive state, but recognizes that it is source connected.

Step 4.

A current source to approximate a bipolar current is attached across the source and drain nodes of transistors that are off, in this example devices P22, P24, N20 and N24, and whose conditions could lead to leakage if the noise on the input nodes rises to a sufficient value to cause the transistor to conduct.

Since transistor N20 is off and its source and drain values are connected to nodes set at opposite values. Leakage through N20 could affect the output voltage at output 16.

A current source is attached across the source and drain nodes of device N20, from output 16 to internal node 12. The waveform shape of the current source is determined by the device width of transistor N20. The shape of the curve is not consequential to the eventual output voltage deviation, so a simple triangle wave may be used such that the total area is equal to the total integrated charge for this device, calculated in units of coulombs per unit of width.

Step 5.

The circuit is presented to the simulator for simulation.

Step 6.

The initial input voltages are applied to the circuit.

Step 7.

The input voltages are adjusted to show noise on the inputs. For example, input 20 is initially set low (0), but is adjusted to go high (1) to simulate noise received. Inputs 22 and 24 remain at their initial states of a logic 1.

Step 8.

The circuit's response at output 16 is measured. The measured value can be compared to other output responses of the same circuit for different input conditions. The worst response is noted, based on any desired comparison method (amplitude comparisons, wave shape comparisons, etc.).

The voltage wave at output 16 is saved and compared to waves from other simulations of this circuit such that output 16 is at a stable initial value of 1. The worst is saved and reported.

Figure 3:
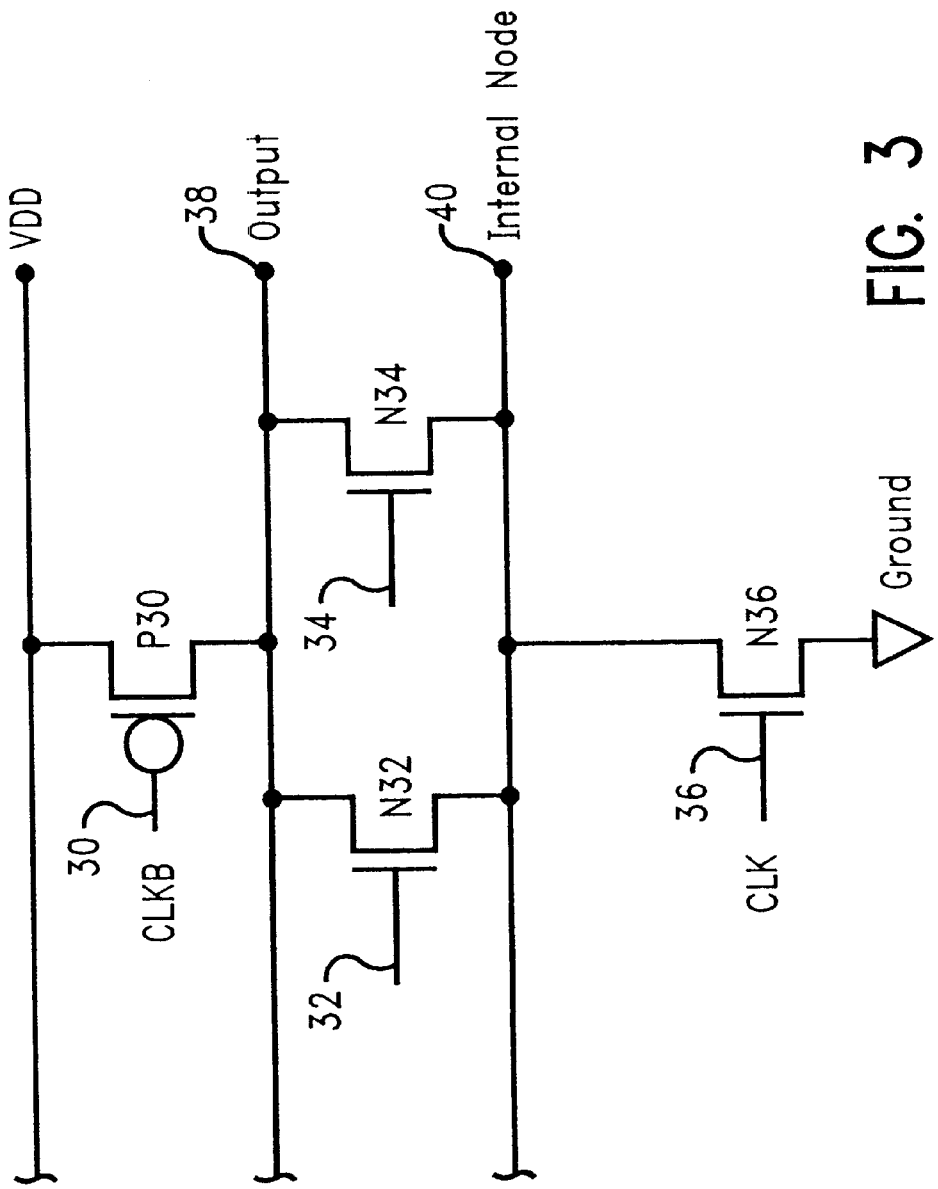
FIG. 3 is a schematic drawing of a two-input dynamic NOR gate.

Example 2 (FIG. 3)

In FIG. 3, a schematic of a two-input dynamic NOR gate is shown. In this example, step 3 of example 1 is replaced with step 4, and only a leakage noise analysis is conducted.

The execution of the invention on the following network is described, where

P is used to represent a pFET device, and

N is used to represent an nFET device.

Input pins are labeled as 32, 34, CLKB 30 and CLK 36. The output pin is labeled 38. The internal node is labeled as 40.

Step 1

This circuit is described in the data model as an interconnection of nets, sources, and devices.

Step 2

Input voltages are determined such that they precondition the circuit for a worst-case response to noise.

In this case, we are only measuring leakage noise.

For example, initially, nFETs N32 and N34 are set to be off (input 32 and 34=0), and output 38 is precharged high. CLKB 30 is logic high (1) and CLK 36 is logic low (0).

If input 32 or 34 is high (1) during an evaluate phase (when CLK 36 is high (1)), output 38 will discharge to 0. As long as both input 32 and 34 remain low (0) during the evaluate phase, output 38 remains high (1).

If output 38 is precharged high, and either input 32 or 34 goes high with CLK 36 low, internal node 40 will charge high (1).

If neither input 32 nor 34 is high during the evaluate phase, CLK 36 is high and internal node 40 is precharged high, internal node 40 will discharge to ground. With SOI circuits, the body-source junction of the off nFETs N32 and N34 are forward-biased and the parasitic leakage current can flow, causing the voltage on the output 38 to fall.

The static analysis tool would set up this condition, charging output node 38 high and internal node 40 high bringing the CLK 36 low.

Step 4 (Replaces Step 3 of Example 1)

A current source to approximate the bipolar current is attached across the source and drain nodes of transistors that are off and whose conditions could lead to leakage. The size of the leakage current source is determined by the size of the device it is attached across.

In this example, current sources are attached across the source and drain of nFETs N32 and N34.

Step 5

The circuit is presented to the simulator for simulation.

Step 6.

The initial input voltages are applied to the circuit.

Step 7.

The input voltages are changed to reflect noise on the input. In this example, input 32 or 34 are changed from low to high which precharges internal node 40 high. Inputs 32 and 34 are then both brought low (0) again. CLK 36 is then brought low.

Step 8.

The circuit's output voltage response on output 38 is measured and recorded.

Step 9.

The circuit's response is compared to other output responses of the same circuit for different input conditions, and the worst is noted, based on any desired comparison method (amplitude comparisons, wave shape comparisons, etc.).

The voltage wave at output 38 is saved and compared to waves from other simulations of this circuit such that output 38 is at a stable initial value of 1. The worst is saved and reported.

Figure 4:
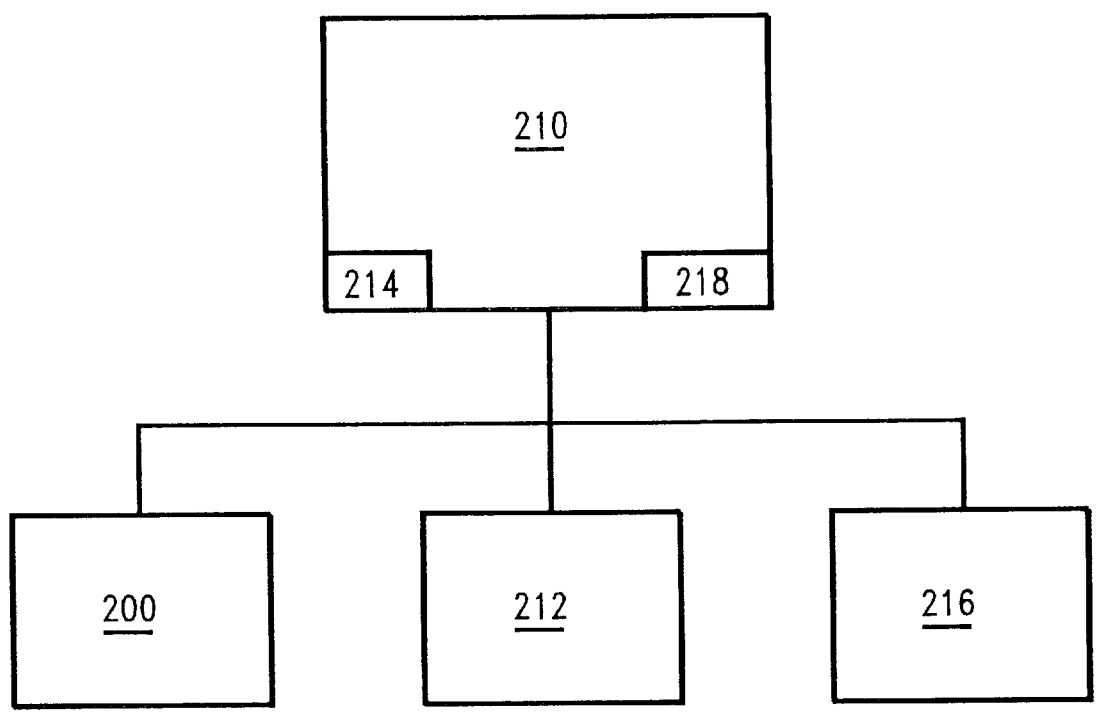
FIG. 4 is a block diagram of the components of the present invention.

A typical electrical noise analysis system of the present invention is illustrated in FIG. 4. A host computer 210 may be linked to circuit simulator 200, circuit analyzer 212, and tester 216. Host computer 210 has a microprocessor for executing stored programs and may include a database 214 on its program storage device for the storage of data of electrical circuits and devices and test programs, which may be downloaded to computer 210. Preferably, database 214, simulator 200, and analyzer 212 and tester 216 are physically present in computer 210, but may be located elsewhere, so long as computer 210 has access to the information therein.

The computer program or software incorporating the method steps and instructions described further below may be stored in both a computer and network server on an otherwise conventional program storage device, such as a semiconductor chip, a read-only memory or magnetic media such as a diskette or a computer hard drive, which is readable and executable by a computer. A screen 218 is able to display the desired simulation analysis and test results accessed from the computer.

The present invention thus provides a method and apparatus to analyze integrated circuits fabricated in a silicon-on-insulator process technology, which takes into account hysteresis effect and parasitic bipolar current voltage, both of which are unique to SOI process technology. By simulating the effects of hysteresis and parasitic bipolar current voltage, the analysis takes into account the behavior of individual transistors in an SOI circuit, and provides a more complete and effective analysis.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for analyzing electrical noise in an integrated circuit fabricated in a silicon-on-insulator process, the method comprising the steps of:
   a) describing an electrical circuit at a transistor level in a data model, said circuit having at least one transistor,
   b) determining at least one input voltage for said transistor, said input voltage selected to precondition said circuit for a worse case response to electrical noise;
   c) selecting a body voltage for said transistor, wherein said body voltage is one that is within normal operational bounds of said transistor and affects a threshold voltage for said transistor such that the said circuit is at its most sensitive state with respect to electrical noise;
   d) determining if said transistor is in an off mode while said circuit is at its most sensitive state with respect to electrical noise,
   e) determining if said transistor is susceptible to a parasitic bipolar leakage current;
   f) simulating the application of a current source across a source and drain node of said transistor in said off mode and is susceptible to said parasitic bipolar leakage current;
   g) repeating steps (b) through (f) for each of a plurality of transistors in said circuit;
   h) presenting said circuit to a simulator for a simulation,
   i) simulating the application of said input voltage to an input of each of said transistors in said circuit;
   j) measuring an output voltage of said circuit at an output node;
   k) adjusting said input voltage to simulate electrical noise on said input of said transistor;
   l) repeating steps (i) through (k) for each of said plurality of transistors in said circuit,
   m) repeating steps (b) through (l) for each of a plurality of input voltages for each of said plurality of said transistors in said circuit, and
   n) determining said circuit's worse case response to electrical noise.

2. The method of claim 1 further including the step of preconditioning said circuit for a worst-case response to electrical noise, said step of preconditioning including the steps of:
   determining an output voltage value of said circuit;
   determining an input voltage condition of said transistor that can cause said output voltage value to change; said input voltage condition corresponding to said input voltage of said transistor;
   repeating the step of determining an input voltage condition of said transistor that can cause said output voltage value to change for each of said plurality of transistors in said circuit.

3. The method of claim 1 wherein said body voltage is selected by the steps of:
   determining a stable output voltage of said circuit responsive to said input voltage;
   determining if said input voltage will cause said transistor to be in a conductive state;
   determining if said transistor in a conductive state will cause a change in the value of said output voltage if said input voltage changes;
   assigning said transistor in a conductive state a first model value corresponding to said body voltage if said transistor in a conductive state will cause a change in the value of said output voltage if said input voltage changes;
   determining if said transistor is in a non-conductive state;
   determining if said transistor in a non-conductive state will cause a change in the value of said stable output voltage if said input voltage changes;
   assigning said transistor in a non-conductive state a second model value corresponding to said body voltage if said transistor will cause a change in the value of said output voltage if said input voltage changes;
   assigning said transistor a third model value corresponding to said body voltage if a change in said input voltage does not cause a change in said output voltage.

4. The method of claim 1 wherein the step of adjusting said input voltage to simulate electrical noise comprises-adjusting said input voltage to cause a high input voltage to go low or a low input voltage to go high.

5. The method of claim 1, wherein the step of determining if said transistor is in an off mode further comprises the steps of:
   determining if said transistor is to be in a partially off mode;
   simulating the application of said current source across said source and drain node of said partially off transistor if said source node of said partially off transistor is charged high while said drain node of said partially off transistor is charged low while said circuit is at its most sensitive state with respect to electrical noise;
   simulating the application of said current source across said source and said drain node of said partially off transistor if said source node of said partially off transistor is charged low while said drain node of said partially off transistor is charged high while said circuit is at its most sensitive state with respect to electrical noise.

6. A method for analyzing electrical noise in an integrated circuit fabricated in a silicon-on-insulator process; the method comprising the steps of:
   a) requesting an analysis of a circuit, said circuit comprising a plurality of electronic components including at least one transistor;
   b) determining an input voltage to be applied to an input of said transistor, said input voltage preconditioning said circuit for a worse case response to an electrical noise input;
   c) determining if said transistor is in an off mode while said circuit is preconditioned for a worst case response to said electrical noise input;
   d) determining if said transistor in an off mode is susceptible to a parasitic bipolar leakage current;
   e) simulating the connection of a current source across a source and drain node of said transistor in an off mode and susceptible to said bipolar leakage current to approximate a bipolar current across said source and drain node;
   f) presenting said circuit to said simulator for simulation;
   g) simulating the application of said input voltage to said circuit;
   h) recording a first output voltage of said circuit;
   i) adjusting said input voltage of said transistor to simulate said electrical noise on said input of said transistor;

j) recording a second output voltage of said circuit responsive to said adjusted input voltage;

k) repeating steps (b) through (j) for each of said at least one transistor in said circuit;

l) comparing said recorded first and second output voltage; and m) determining a worse case response of said circuit to said electrical noise.

7. A program storage device readable by a machine, tangibly embodying a program of instructions executable by the machine to perform method steps for analyzing electrical noise in an integrated circuit fabricated in a silicon-on-insulator process, said method steps comprising:

a) describing an electrical circuit at a transistor level in a data model, said circuit having at least one transistor;

b) determining at least one input voltage for said transistor, said input voltage selected to precondition said circuit for a worse case response to an electrical noise input;

c) selecting a body voltage for said transistor, wherein said body voltage is one that is within normal operational bounds of said transistor and affects a threshold voltage for said transistor such that the said circuit is at its most sensitive state with respect to said electrical noise;

d) determining if said transistor is in an off mode while said circuit is at its most sensitive state with respect to electrical noise;

e) determining if said transistor is susceptible to a parasitic bipolar leakage current;

f) simulating the application of a current source across a source and a drain node of said transistor in an off mode and susceptible to a parasitic bipolar leakage current;

g) repeating steps (b) through (f) for each of a plurality of transistors in said circuit;

h) presenting said circuit to a simulator for a simulation;

i) simulating the application of said input voltage to an input of said transistor;

j) measuring an output voltage of said circuit at an output node;

k) adjusting said input voltage to simulate said electrical noise on said input of said transistor;

l) repeating steps (i) through (k) for each of said plurality of transistors in said circuit;

m) repeating steps (b) through (l) for each of a plurality of input voltages for each of said plurality of said transistors in said circuit; and n) determining said circuit's worse case response to said electrical noise.

8. The program storage device of claim 7 said method steps of preconditioning said circuit for a worst case response to an electrical noise input comprising the steps of:

determining an output voltage value of said circuit;

determining an input voltage condition of said transistor that can cause said output voltage value to change; said input voltage condition corresponding to said input voltage of said transistor;

repeating the step of determining an input voltage condition of said transistor that can cause said output voltage value to change, for each of said plurality of transistors in said circuit.

9. The program storage device of claim 7, said method steps of selecting a body voltage comprising the steps of:

determining a stable output voltage of said circuit responsive to said input voltage;

determining if said input voltage will cause said transistor to be in a conductive state; determining if said transistor in a conductive state will cause a change in the value of said output voltage if said input voltage changes;

assigning said transistor in a conductive state a first model value corresponding to said body voltage if said transistor in a conductive state will cause a change in the value of said output voltage if said input voltage changes;

determining if said transistor is in a non-conductive state;

determining if said transistor in a non-conductive state will cause a change in the value of said stable output voltage if said input voltage changes;

assigning said transistor in a non-conductive state a second model value corresponding to said body voltage if said transistor will cause a change in the value of said output voltage if said input voltage changes;

assigning said transistor a third model value corresponding to said body voltage if a change in said input voltage does not cause a change in said output voltage.

10. The program storage device of claim 7, said method step of adjusting said input voltage comprising adjusting said input voltage to cause a high input voltage to go low or a low input voltage to go high.

11. The program storage device of claim 7, said method step of determining if said transistor is in an off mode further comprising the steps of:

determining if said transistor is to be in a partially off mode;

simulating the application of said current source across said source and drain node of said partially off transistor if said source node of said partially off transistor is charged high while said drain node of said partially off transistor is charged low while said circuit is at its most sensitive state with respect to electrical noise;

simulating the application of said current source across said source and said drain node of said partially off transistor if said source node of said partially off transistor is charged low while said drain node of said partially off transistor is charged high while said circuit is at its most sensitive state with respect to electrical noise.

12. A program storage device readable by a machine, tangibly embodying a program of instructions executable by the machine to perform method steps for analyzing electrical noise and an integrated circuit fabricated in a silicon-on-insulator process, said method steps comprising:

a) requesting an analysis of a circuit, said circuit comprising a plurality of electronic components including at least one transistor;

b) determining an input voltage to be applied to an input of said transistor, said input voltage preconditioning said circuit for a worse case response to an electrical noise input;

c) determining if said transistor is in an off mode while said circuit is preconditioned for a worst case response to said electrical noise input;

d) determining if said transistor is susceptible to a parasitic bipolar leakage current;

e) simulating the electrical connection of a current source across a source and drain node of said transistor in an off mode and susceptible to said bipolar leakage current to approximate a bipolar current across said source and drain node;

f) presenting said circuit to said simulator for simulation;
g) simulating the application of said input voltage to said circuit;
h) recording a first output voltage of said circuit;
i) adjusting said input voltage of said transistor to simulate said electrical noise on said input of said transistor;
j) recording a second output voltage of said circuit responsive to said adjusted input voltage;
k) repeating steps (b) through (j) for each of said at least one transistor in said circuit;
l) comparing said first and second recorded output voltage; and
m) determining a worse case response of said circuit to said electrical noise.

13. An article of manufacture comprising:
a computer usable medium having computer readable code means embodied therein for causing the analysis of electrical noise in an integrated circuit fabricated in a silicon-on-insulator process, the computer readable code means comprising: a computer useable medium having computer readable code means embodied in said medium for causing the analysis of electrical noise in an integrated circuit fabricated in a silicon-on-insulator process, said computer program product having:
  computer readable code means for causing a computer to simulate an electrical circuit at a transistor level in a data model, said circuit including at least one transistor;
  computer readable code means for causing a computer to develop a set of input voltages to precondition said circuit for a worst case response to an electrical noise;
  computer readable code means for causing a computer to determine a body voltage for said transistor wherein said body voltage is one that is within normal operational bounds of said transistor and affects a threshold voltage for said transistor such that the said circuit is at its most sensitive state with respect to electrical noise;
  computer readable code means for causing a computer to determine if said transistor is in an off mode while said circuit is preconditioned for a worst case response to said electrical noise input;
  computer readable code means for causing a computer to determine if said transistor in an off mode is susceptible to a parasitic bipolar leakage current;
  computer readable code means for causing a computer to simulate the application of a current source across a source and a drain node of said transistor that is in an off mode and susceptible to said leakage current;
  computer readable code means for causing a computer to analyze a response of said circuit to said input voltage;
  computer readable code means for causing a computer to adjust said input voltage of said transistor to simulate said electrical noise on said input of said transistor;
  computer readable code means for causing a computer to analyze a response of said circuit to said adjusted input voltage;
  computer readable code means for causing a computer to analyze a response of said circuit to at least one second input voltage from said set of input voltages;
  computer readable code means for causing a computer to determine said circuit's worst case response to noise.

14. The article of claim 13 wherein said computer readable code means for causing a computer to precondition said circuit for a worst case response to an electrical noise input comprises:
  computer readable code means for causing a computer to determine an output voltage value of said circuit;
  computer readable code means for causing a computer to determine an input voltage condition of said transistor that can cause said output voltage value to change; said input voltage condition corresponding to said input voltage of said transistor;
  computer readable code means for causing a computer to repeat the step of determining an input voltage condition of said transistor tat can cause said output voltage value to change for each of said at least one transistor in said circuit.

15. The article of claim 13 wherein said computer readable code means causing a computer to select a body voltage comprises:
  computer readable code means for causing a computer to determine a stable output voltage of said circuit responsive to said input voltage;
  computer readable code means for causing a computer to determine if said input voltage will cause said transistor to be in a conductive state;
  computer readable code means for causing a computer to determine if said transistor in a conductive state will cause a change in the value of said output voltage if said input voltage changes;
  computer readable code means for causing a computer to assign said transistor in a conductive state a first model value corresponding to said body voltage if said transistor in a conductive state will cause a change in the value of said output voltage if said input voltage changes;
  computer readable code means for causing a computer to determine if said transistor is in a non-conductive state;
  computer readable code means causing a computer to determine if said transistor in a non-conductive state will cause a change in the value of said stable output voltage if said input voltage changes;
  computer readable code means for causing a computer to assign said transistor in a non-conductive state a second model value corresponding to said body voltage if said transistor will cause a change in the value of said output voltage if said input voltage changes;
  computer readable code means for causing a computer to assign said transistor a third model value corresponding to said body voltage if a change in said input voltage does not cause a change in said output voltage.

16. The article of claim 13 wherein said computer readable code means for causing a computer to adjust said input voltage comprises computer readable code means for causing a computer to cause a high input voltage to go low or a low input voltage to go high.

17. The article of claim 13 wherein said computer readable code means for causing a computer to determine if said transistor is in an off mode further comprises:
  computer readable code means for causing a computer to determine if said transistor is to be in a partially off mode;
  computer readable code means for causing a computer to simulate the application of said current source across said source and drain node of said partially off transistor if said source node of said partially off transistor is charged high while said drain node of said partially off transistor is charged low while said circuit is at its most sensitive state with respect to electrical noise;

computer readable code means for causing a computer to simulate the application of said current source across said source and said drain node of said partially off transistor if said source node of said partially off transistor is charged low while said drain node of said partially off transistor is charged high while said circuit is at its most sensitive state with respect to electrical noise.

18. An article of manufacture comprising:

a computer usable medium having computer readable code means embodied therein for causing the analysis of electrical noise in an integrated circuit fabricated in a silicon-on-insulator process, the computer readable code means comprising:

computer readable code means for causing a computer to effect the simulation of an electrical circuit to be analyzed, said circuit having at least one transistor;

computer readable code means for causing a computer to determine an input voltage for said transistor, said input voltage selected to precondition said circuit for a worst case response to an electrical noise input;

computer readable code means for causing a computer to determine if transistor is in an off mode while said circuit is preconditioned for a worst case response to said electrical noise;

computer readable code means for causing a computer to determine if said transistor in an off mode is susceptible to a parasitic bipolar leakage current;

computer readable code means for causing a computer to simulate the application of a current source across a source and a drain node of said transistor that is in an off mode and susceptible to said leakage current;

computer readable code means for causing a computer to simulate a response of said circuit to said input voltage;

computer readable code means for causing a computer to record said response of said circuit to said input voltage;

computer readable code means for causing a computer to adjust said input voltage to simulate electrical noise;

computer readable code means for causing a computer to record said response of said circuit to said adjusted input voltage;

computer readable code means for causing a computer to determine said circuit's worst case response to electrical noise;

computer readable code means for causing a computer to repeat the foregoing steps for each of said at least one transistor in said circuit;

computer readable code means for causing a computer to repeat the foregoing steps for at least one second input voltage.

19. A computer program product for use with an electrical circuit testing apparatus, said computer program product comprising:

a computer useable medium having computer readable code means embodied in said medium for causing the analysis of electrical noise in an integrated circuit fabricated in a silicon-on-insulator process, said computer program product having:

computer readable code means for causing a computer to describe an electrical circuit in a data model, said circuit having at least one transistor;

computer readable code means for causing a computer to determine at least one input voltage for said transistor, said input voltage selected to precondition said circuit for a worst case response to said electrical noise;

computer readable code means for causing a computer to select a body voltage for said transistor, wherein said body voltage is one that is within normal operational bounds of said transistor and affects a threshold voltage for said transistor such that said circuit is at its most sensitive state with respect to said electrical noise;

computer readable code means for causing a computer to determine if said transistor is to be in an off mode while said circuit is at its most sensitive state with respect to electrical noise;

computer readable code means for causing a computer to determine if said transistor is susceptible to a parasitic bipolar leakage current;

computer readable code means for causing a computer to simulate a current source to be applied across a source and a drain node of said transistor if said transistor is to be in an off mode and is susceptible to said bipolar leakage current;

computer readable code means for causing a computer to repeat the foregoing steps for each of a plurality of transistors in said circuit;

computer readable code means for causing a computer to simulate the application of said input voltage to an input of said transistor;

computer readable code means for causing a computer to measure a response of said circuit to said input voltage;

computer readable code means for causing a computer to adjust said input voltage to simulate electrical noise on said input of said transistors;

computer readable code means for causing a computer to measure a response of said circuit to said adjusted input voltage;

computer readable code means for causing a computer to repeat the foregoing steps for each of a plurality of input voltages;

computer readable code means for causing a computer to determine said circuit's worst-case response to said electrical noise.

20. The computer program product of claim 19, said computer program product further comprising:

computer readable code means for causing a computer to determine an output voltage value of said circuit;

computer readable code means for causing a computer to determine an input voltage condition of said transistor that can cause said output voltage value of said circuit to change;

computer readable code means for causing a computer to store said input voltage condition to create said set of input voltages;

computer readable code means for causing a computer to repeat the foregoing steps for each of said plurality of transistors in said circuit.

21. The computer pro(gram product of claim 19, said wherein:

computer readable code means for causing a computer to select a body voltage comprises:

computer readable code means for causing a computer to determine a stable output voltage of said circuit responsive to said input voltage;

computer readable code means for causing a computer to determine if said input voltage will cause said transistor to be in a conductive state;

computer readable code means for causing a computer to determine if said transistor in a conductive state will cause a change in the value of said output voltage if said input voltage changes;

computer readable code means for causing a computer to assign said transistor in a conductive state a first model value corresponding to said body voltage if said transistor in a conductive state will cause a change in the value of said output voltage if said input voltage changes;

computer readable code means for causing a computer to determine if said transistor is in a non-conductive state;

computer readable code means causing a computer to determine if said transistor in a non-conductive state will cause a change in the value of said stable output voltage if said input voltage changes;

computer readable code means for causing a computer to assign said transistor in a non-conductive state a second model value corresponding to said body voltage if said transistor will cause a change in the value of said output voltage if said input voltage changes;

computer readable code means for causing a computer to assign said transistor a third model value corresponding to said body voltage if a change in said input voltage does not cause a change in said output voltage.

22. The computer program product of claim 19, said computer program product further comprising computer readable code means for causing a computer to adjust said input voltage by causing a normally high input voltage to go low and a normally low input voltage to go high.

23. The computer program product of claim 19, said computer program product further comprising:

computer readable code means for causing a computer to determine if said transistor is to be in a partially off mode;

computer readable code means for causing a computer to determine if a source node is charged high and a drain node is charged low of said transistor in said partially off mode;

computer readable code means for causing(y a computer to simulate the application of a current source across a source and a drain node of said transistor in said partially off mode if said source node is charged high and said drain node is charged low;

computer readable code means for causing a computer to determine if said source node is charged low and said drain node is charged high of said transistor in said partially off mode;

computer readable code means for causing a computer to simulate the application of a current source across said source and drain node of said transistor in said partially off mode if said source node is charged low and said drain node is charged high.

24. A computer program product for use with an electrical circuit testing apparatus, said computer program product comprising:

a computer useable medium having computer readable code means embodied in said medium for causing the analysis of electrical noise in an integrated circuit fabricated in a silicon-on-insulator process, said computer program product having:

computer readable code means for causing a computer to model said electrical circuit, said circuit including at least one transistor;

computer readable code means for causing a computer to determine an input voltage to be applied to an input of said transistor;

computer readable code means for causing a computer to determine if said transistor is to be in an off mode;

computer readable code means for causing a computer to determine if said transistor is susceptible to a parasitic bipolar leakage current;

computer readable code means for causing a computer to simulate the application of a current source across a source and a drain node of said transistor in said off mode and susceptible to said parasitic bipolar leakage current;

computer readable code means for causing a computer to simulate said circuit;

computer readable code means for causing a computer to simulate the application of said input voltage to said transistor;

computer readable code means for causing a computer to record a response on an output node of said circuit;

computer readable code means for causing a computer to adjust said input voltage to show electrical noise on said input of said transistor;

computer readable code means for causing a computer to record said response on said output node of said circuit;

computer readable code means for causing a computer to repeat the foregoing steps for each of a plurality of transistors in said circuit;

computer readable code means for causing a computer to compare each of said recorded responses;

computer readable code means for causing a computer to determine said circuit's worst case response to electrical noise.

* * * * *